(«12») United States Patent
Momii (10) Patent No.: US 7,757,143 B2
(45) Date of Patent: Jul. 13, 2010

(54) SEMICONDUCTOR DEVICE INCLUDING CONCEALABLE TEST TERMINALS

(75) Inventor: Masato Momii, Hokkaido (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 745 days.

(21) Appl. No.: 11/677,123

(22) Filed: Feb. 21, 2007

(65) Prior Publication Data

US 2007/0234167 A1   Oct. 4, 2007

(30) Foreign Application Priority Data

Feb. 21, 2006 (JP) .............................. 2006-043980
Jan. 22, 2007 (JP) .............................. 2007-011478

(51) Int. Cl.
*G01R 31/28* (2006.01)
(52) U.S. Cl. ....................... 714/742; 714/724
(58) Field of Classification Search ................. 714/724, 714/742
See application file for complete search history.

(56) References Cited

U.S. PATENT DOCUMENTS 6,059,450 A * 5/2000 McClure ..................... 714/724
6,240,534 B1 * 5/2001 Nakane ........................ 714/55
6,269,288 B1 * 7/2001 Smith ......................... 700/295
7,401,279 B2 * 7/2008 Sumita et al. ............... 714/727
7,415,647 B2 * 8/2008 Yee ............................. 714/734

FOREIGN PATENT DOCUMENTS

JP        2005-229056         8/2005

* cited by examiner

*Primary Examiner*—James C Kerveros
(74) *Attorney, Agent, or Firm*—Ladas & Parry LLP (57) ABSTRACT

A semiconductor device includes one or more test terminals and a test control circuit is disclosed. The test control circuit tests an internal circuit according to the signals received from the one or more test terminals. Afterwards, specification information held in a specification information holding unit is renewed such that one or more inputs of the test control circuit are fixed to a predetermined level.

8 Claims, 8 Drawing Sheets

| TERMINAL FIXING INFORMATION | FIXED BIT INFORMATION | |
|---|---|---|
| | FIRST BIT | SECOND BIT |
| ENABLE | 0 | 1 |

SEMICONDUCTOR DEVICE INCLUDING CONCEALABLE TEST TERMINALS

BACKGROUND OF THE INVENTION

1. Field of the Invention

The present invention relates generally to semiconductor devices, and more particularly to a semiconductor device including a test terminal.

2. Description of the Related Art

Semiconductor devices are generally provided with a test terminal that is used only at the time of evaluating device characteristics or performing delivery inspections. Such a test terminal is not used in a finished product. Therefore, in a finished product, the voltage of the test terminal is fixed at a high level or a low level by, for example, connecting it to a lead frame by bonding (see, for example, Patent Document 1).

Figure 8A:
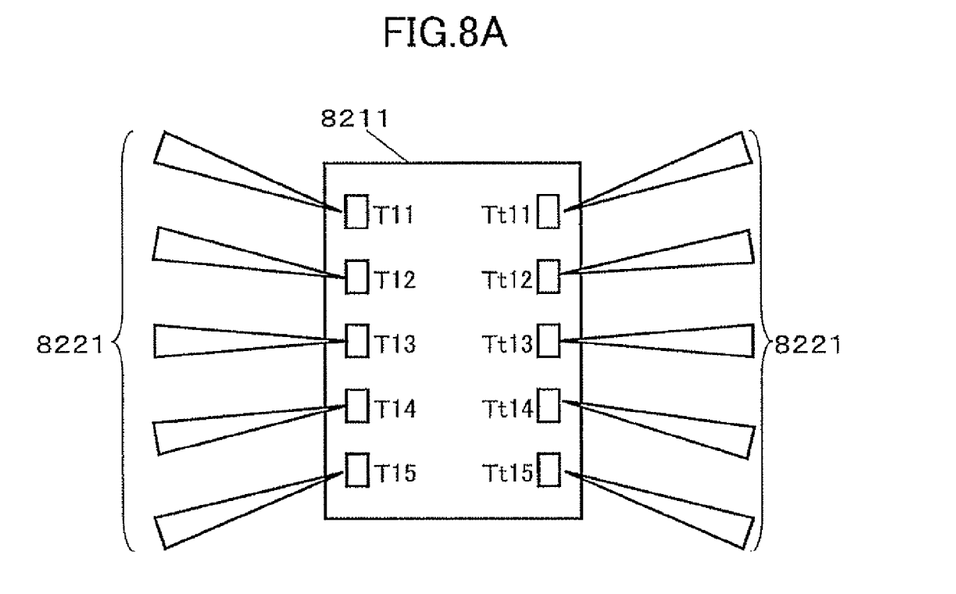
FIGS. 8A, 8B illustrate a conventional example.
Figure 8B:
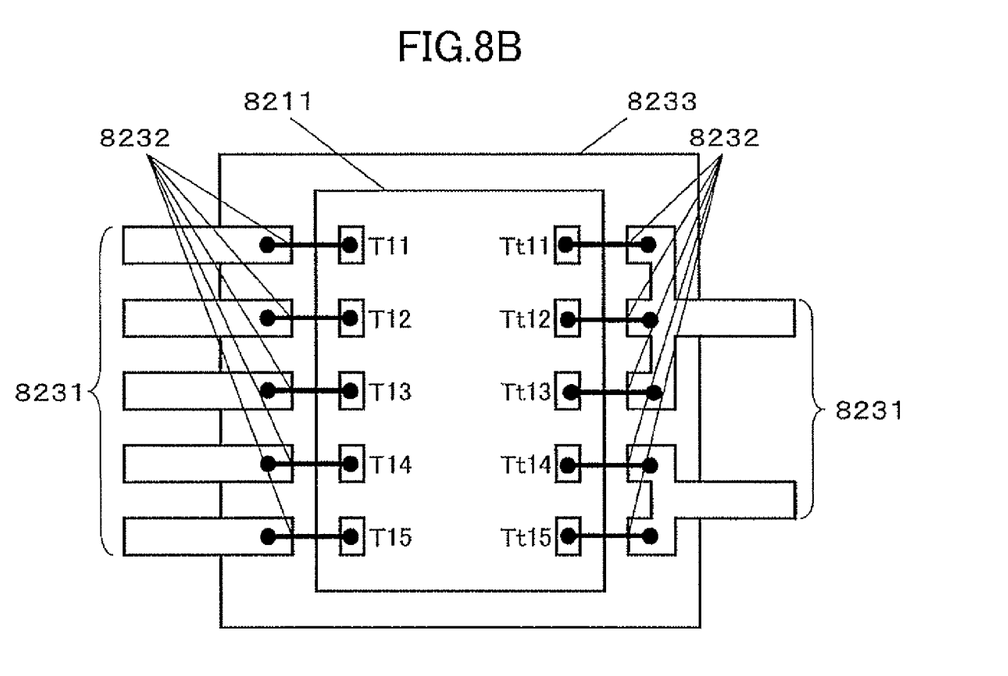

FIGS. 8A, 8B illustrate a conventional example.

As shown in FIG. 8A, to test a circuit mounted on a semiconductor chip 8211, probes 8221 of an inspection device are directly brought in contact with terminals T11-T15 and test terminals Tt11-Tt15 provided on the semiconductor chip 8211.

After the test, as shown in FIG. 8B, wires 8232 of the terminals T11-T15 and the test terminals Tt11-Tt15 are wire-bonded to lead frames 8231, and the semiconductor chip 8211 is packaged in a package 8233, thus forming a finished product. Accordingly, the voltage of the test terminals Tt11-Tt15 is fixed at a high level or a low level by the lead frames 8231.

Patent Document 1: Japanese Laid-Open Patent Application No. 2005-229056

In such a conventional semiconductor device, the voltage of the test terminals Tt11-Tt15 is fixed at a high level or a low level by connecting the test terminals Tt11-Tt15 to the lead frames 8231 by wire bonding. Therefore, extra lead frames need to be provided for the test terminals.

Furthermore, the test terminals need to have large enough pad sizes to be wire bonded and extra space is thus required. As a result, a large mounting area is required on the substrate.

Moreover, in case the semiconductor device needs to be diagnosed after shipment, it is necessary to take the trouble of removing the lead frames fixing the voltage of the test terminals Tt11-Tt15 at a high level or a low level. Furthermore, another company might use the test terminals to evaluate characteristics of the semiconductor device.

SUMMARY OF THE INVENTION

The present invention provides a semiconductor device in which one or more of the above-described disadvantages are eliminated.

A preferred embodiment of the present invention provides a semiconductor device in which test terminals are connected to a test control circuit only when the semiconductor device is being tested.

An embodiment of the present invention provides a semiconductor device including one or more test terminals; a test control circuit configured to receive signals as one or more inputs thereof from the one or more test terminals to test an internal circuit by changing a status of the internal circuit according to the signals; a non-volatile storage unit configured to store specification information used for specifying a connection status of the one or more test terminals; a specification information holding unit configured to hold the specification information; a transfer control unit configured to transfer the specification information from the non-volatile storage unit to the specification information holding unit when power is turned on; and a test terminal status determining unit configured to determine the connection status of the one or more test terminals according to the specification information received from the specification information holding unit; wherein after the test control circuit tests the internal circuit according to the signals received from the one or more test terminals, the specification information held in the specification information holding unit is renewed such that the one or more inputs of the test control circuit are fixed to a predetermined level.

According to one embodiment of the present invention, test terminals are connected to a test control circuit only when a semiconductor device is being tested.

BRIEF DESCRIPTION OF THE DRAWINGS

Other objects, features and advantages of the present invention will become more apparent from the following detailed description when read in conjunction with the accompanying drawings, in which:

FIG. 5 is a signal wave form chart for describing operations performed when power of the semiconductor device is turned on;

DETAILED DESCRIPTION OF THE PREFERRED EMBODIMENTS

A description is given, with reference to the accompanying drawings, of an embodiment of the present invention.

Figure 1:
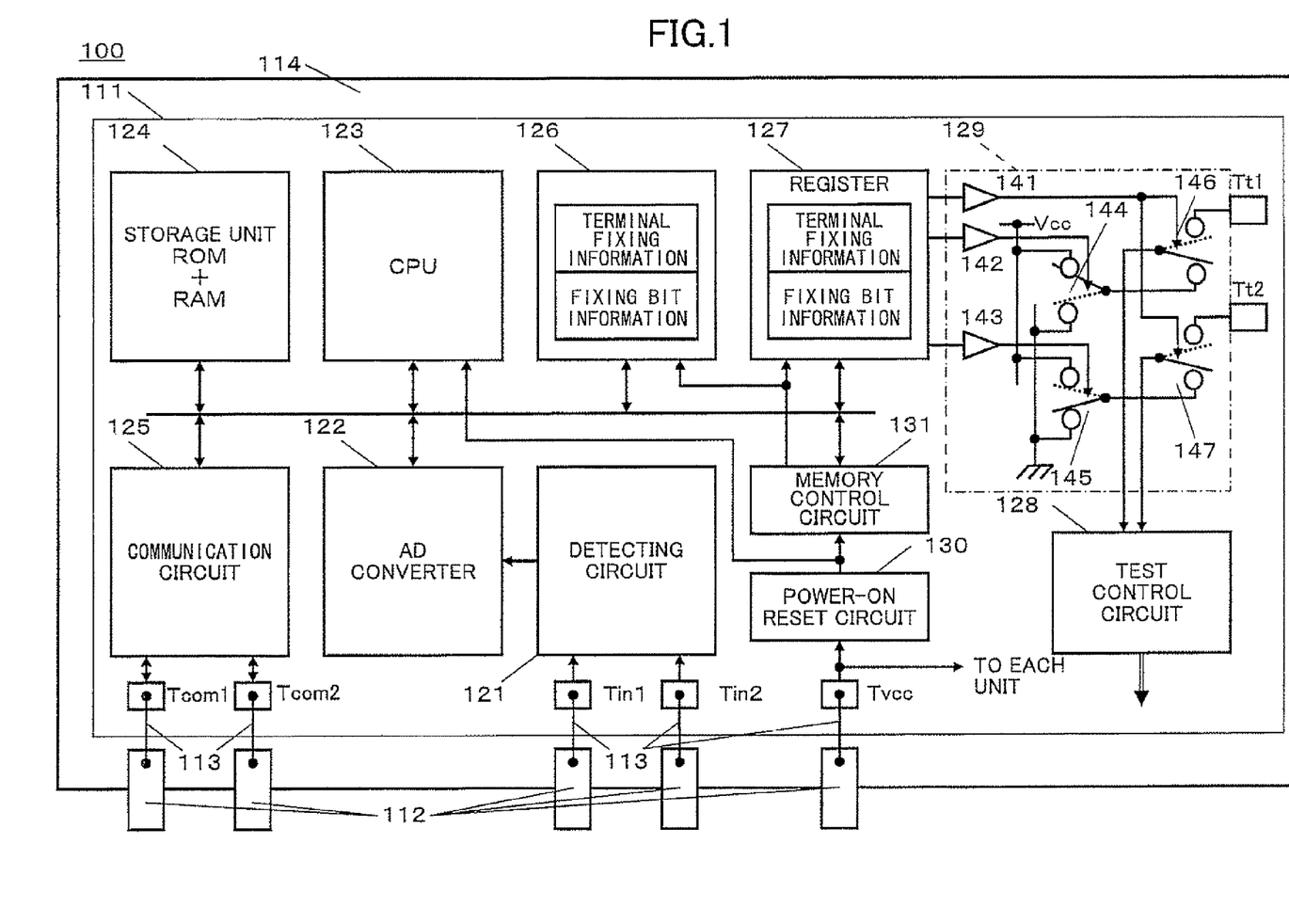
FIG. 1 is a block diagram of a semiconductor device according to an embodiment of the present invention.

FIG. 1 is a block diagram of a semiconductor device according to an embodiment of the present invention.

A semiconductor device 100 according to an embodiment of the present invention includes a semiconductor chip 111, lead frames 112, bonding wires 113, and a package 114.

The semiconductor chip 111 is a semiconductor device configured with one chip, and includes a detecting circuit 121, an AD converter 122, a CPU 123, a storage unit 124, a communication circuit 125, a non-volatile memory 126, a register 127, a test control circuit 128, a test terminal status determining circuit 129, a power-on reset circuit 130, a memory control circuit 131, input output terminals Tcom1, Tcom2, Tin1, Tin2, and test terminals Tt1, Tt2.

The detecting circuit 121 receives analog signals from the terminals Tin1, Tin2. The detecting circuit 121 supplies analog values obtained by detecting the analog signals to the AD converter 122. The AD converter 122 converts the analog values received from the detecting circuit 121 into digital values.

The digital values output by the AD converter 122 are loaded in a RAM inside the storage unit 124 and processed by the CPU 123. The CPU 123 executes a process based on a program initially installed in a ROM inside the storage unit 124. The process results are output from, for example, the terminals Tcom1, Tcom2 via the communication circuit 125.

The communication circuit 125 communicates with an external circuit via the terminals Tcom1, Tcom2.

The non-volatile memory 126 is configured with a rewritable, non-volatile memory such as EEPROM, and stores specification information. The specification information is an initial value set when the semiconductor device 100 is manufactured, and a predetermined value is written in the non-volatile memory 126 when the semiconductor device 100 is being inspected.

Figure 2:
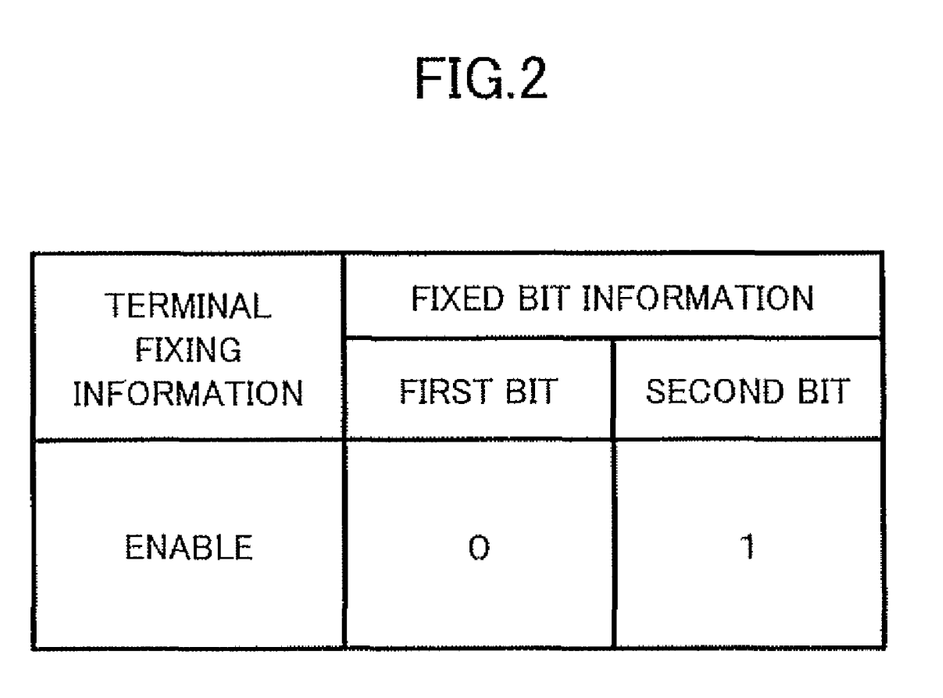
FIG. 2 illustrates a data configuration of specification information.

FIG. 2 illustrates a data configuration of the specification information.

Terminal fixing information of at least one bit and fixing bit information of, for example, two bits are stored as the specification information. The terminal fixing information specifies whether to enable or disable a status in which input to the test control circuit 128 corresponding to the test terminals Tt1, Tt2 is fixed at a predetermined level. When such a status is enabled (fixed), the test terminals Tt1, Tt2 are separated from the test control circuit 128. When such a status is disabled (not fixed), the test terminals Tt1, Tt2 are connected to the test control circuit 128. For example, "1" specifies to enable the status of fixing input corresponding to the test terminals Tt1, Tt2, and "0" specifies to disable the status of fixing the test terminals Tt1, Tt2.

The fixing bit information determines the levels of input to the test control circuit 128 corresponding to the test terminals Tt1, Tt2. A first bit determines the level of input to the test control circuit 128 corresponding to the test terminal Tt1, and a second bit determines the level of input to the test control circuit 128 corresponding to the test terminal Tt2.

In FIG. 2, the first bit is "0" and the second bit is "1". Accordingly, the input to the test control circuit 128 corresponding to the test terminal Tt1 is fixed at a low level, for example, ground level, and the input of the test control circuit 128 corresponding to the test terminal Tt2 is fixed at a high level, for example, a power supply voltage Vcc.

Data stored in the non-volatile memory 126 is automatically transferred to the register 127 by the memory control circuit 131 when power is turned on.

The register 127 holds the terminal fixing information and the fixing bit information transferred from the non-volatile memory 126 when the power is turned on. The terminal fixing information and the fixing bit information held in the register 127 are supplied to the test terminal status determining circuit 129.

The register 127 is a general-purpose register used when the CPU 123 operates, and the terminal fixing information and the fixing bit information are held in a part of the register 127. The part of the non-volatile memory 126 where the specification information is stored and the part of the register 127 where the terminal fixing information and the fixing bit information are held are system areas that general users cannot access. This configuration significantly helps to prevent another company from evaluating characteristics of the semiconductor device by using the test terminals.

When input is received from the test terminals Tt1 Tt2, the test control circuit 128 changes the status of the internal circuit according to the input. Accordingly, the internal circuit can be tested by the test control circuit 128.

The test terminal status determining circuit 129 is provided between the test terminals Tt1, Tt2 and the test control circuit 128, and includes drivers 141-143 and switches 144-147.

The driver 141 receives terminal fixing information from the register 127. The driver 141 drives the switches 146, 147 based on the terminal fixing information received from the register 127. When the terminal fixing information stored in the register 127 indicates enable "1" and output of the driver 141 is "1", the switches 146, 147 cut off the test terminals Tt1, Tt2 from the test control circuit 128 as indicated by solid lines in FIG. 1, so that signals from the switches 144, 145 are supplied to the test control circuit 128. When the terminal fixing information stored in the register 127 indicates disable "0" and output of the driver 141 is "0", the switches 146, 147 connect the test terminals Tt1, Tt2 to the test control circuit 128 as indicated by dotted lines in FIG. 1.

The driver 142 receives the first bit of the fixing bit information from the register 127. When the first bit of the fixing bit information received from the register 127 indicates "1", the driver 142 shifts the switch 144 so that the power supply voltage Vcc is supplied to the switch 146, as indicated by the solid line. When the first bit of the fixing bit information received from the register 127 indicates "0", the driver 142 shifts the switch 144 so that input supplied to the switch 146 becomes ground level, as indicated by the dotted line.

The driver 143 receives the second bit of the fixing bit information from the register 127. When the second bit of the fixing bit information received from the register 127 indicates "1", the driver 143 shifts the switch 145 so that the power supply voltage Vcc is supplied to the switch 147, as indicated by the dotted line. When the second bit of the fixing bit information received from the register 127 indicates "0", the driver 143 shifts the switch 145 so that input supplied to the switch 147 becomes ground level, as indicated by the solid line.

The power-on reset circuit 130 is connected to a power supply terminal Tvcc. The power-on reset circuit 130 generates a power reset signal in response to power supply voltage received by the power supply terminal Tvcc. The power-on reset signal rises when the power supply terminal Tvcc rises, becomes high-level, and then becomes low-level after the passage of a predetermined time interval. In response to a falling edge of the power-on reset signal, the CPU 123 starts counting the time for cancelling the reset status, and when sufficient time passes so that operations of the semiconductor device 100 are stabilized, the reset status is cancelled.

The memory control circuit 131 receives power-on reset signals from the power-on reset circuit 130. In response to a falling edge of the power-on reset signal, i.e., at a time when the power-on reset circuit 130 starts operating, the memory control circuit 131 controls the non-volatile memory 126 and the register 127 so as to transfer the terminal fixing information and the fixing bit information stored in the non-volatile memory 126 to the register 127. The reset status of the semiconductor device 100 is cancelled after this operation is completed.

<Operation>

Figure 3:
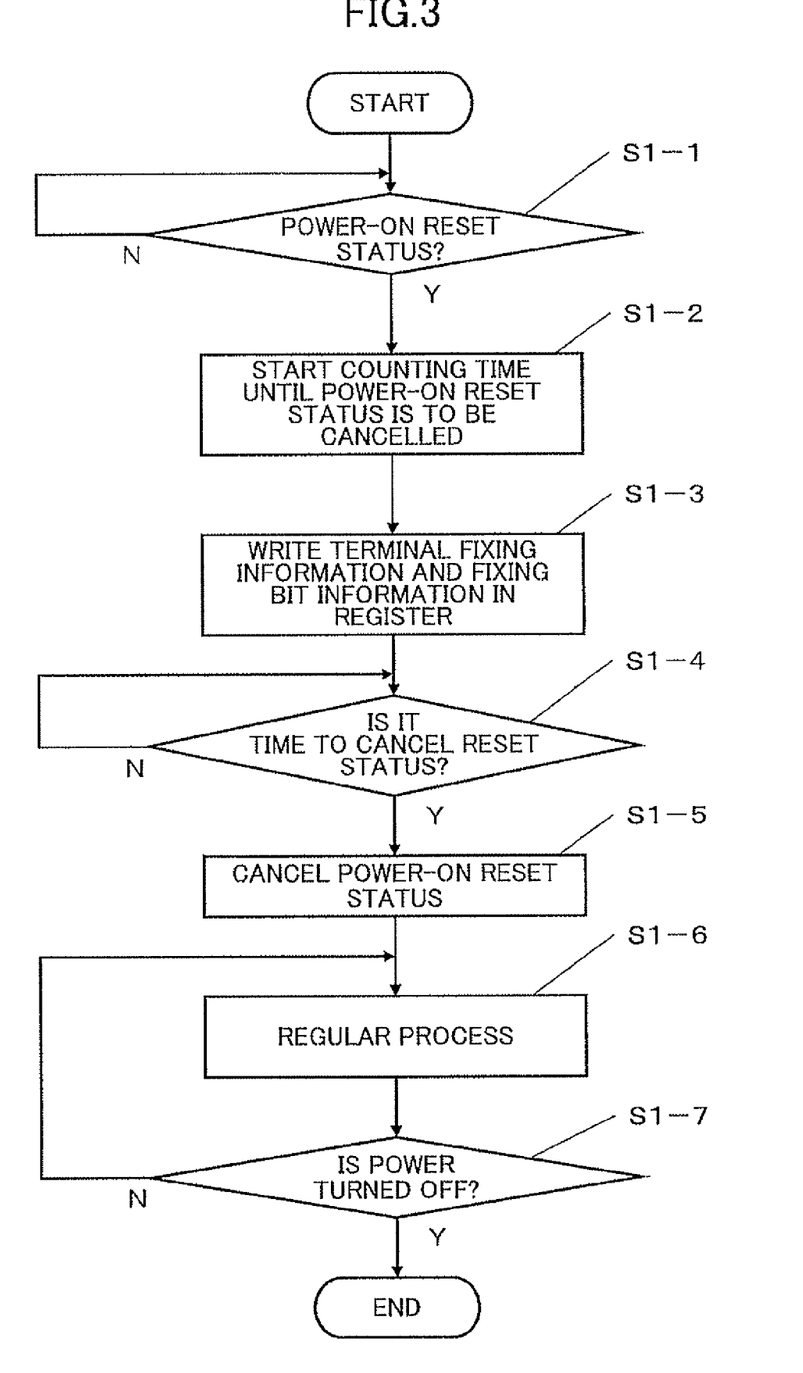
FIG. 3 is a flowchart of a process performed when the semiconductor device starts up.

FIG. 3 is a flowchart of a process performed when the semiconductor device 100 starts up.

When the power of the semiconductor device 100 is turned on and a power-on reset status starts at step S1-1, the CPU 123 starts counting the time at step S1-2 until the reset status is to be cancelled, and the memory control circuit 131 transfers the terminal fixing information and the fixing bit information stored in the non-volatile memory 126 to the register 127 at step S1-3. The register 127 holds the terminal fixing information and the fixing bit information transferred from the non-volatile memory 126 by the memory control circuit 131.

When the memory control circuit 131 transfers the terminal fixing information and the fixing bit information from the non-volatile memory 126 to the register 127 and the terminal information becomes definite, it is determined that the reset status can be cancelled at step S1-41 the reset status of the semiconductor device 100 is cancelled at step S1-5, and a regular process operation (in the case of conducting a test, a test process operation) is executed at step S1-6. Until the power is turned off at step S1-7, the regular process is executed. When the power is cut off at step S1-7, the information stored in the register 127 is deleted.

When the power is turned on and the terminal fixing information and the fixing bit information is loaded in the register 127 and then supplied to the test terminal status determining circuit 129, the test terminal status determining circuit 129 is controlled so that input to the test control circuit 128 corresponding to the test terminals Tt1, Tt2 is fixed at or released from "1" or "0". The terminal fixing information and the fixing bit information are specified according to the circuit configuration of the test control circuit 128, and when the terminal fixing information and the fixing bit information are set in the register 127, the status of the test control circuit 128 becomes a non-operating status or a non-test status.

When the status of the test control circuit 128 becomes a non-operating status or a non-test status, the CPU 123 can start a process based on a program to execute the regular operation.

Figure 4A:
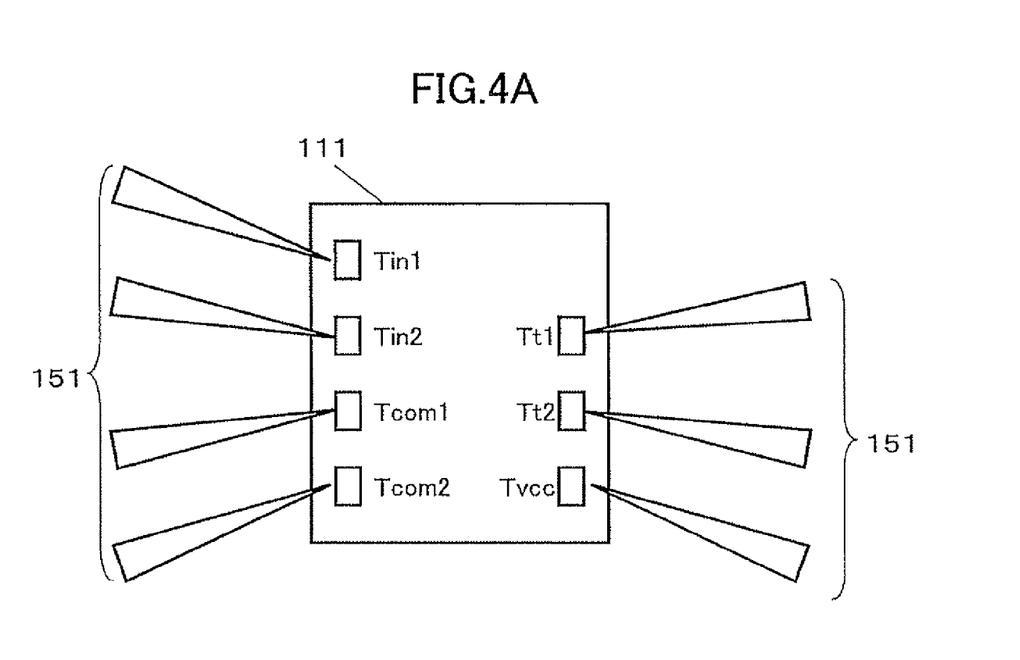
FIGS. 4A, 4B illustrate an example of an application of an embodiment of the present invention.
Figure 4B:
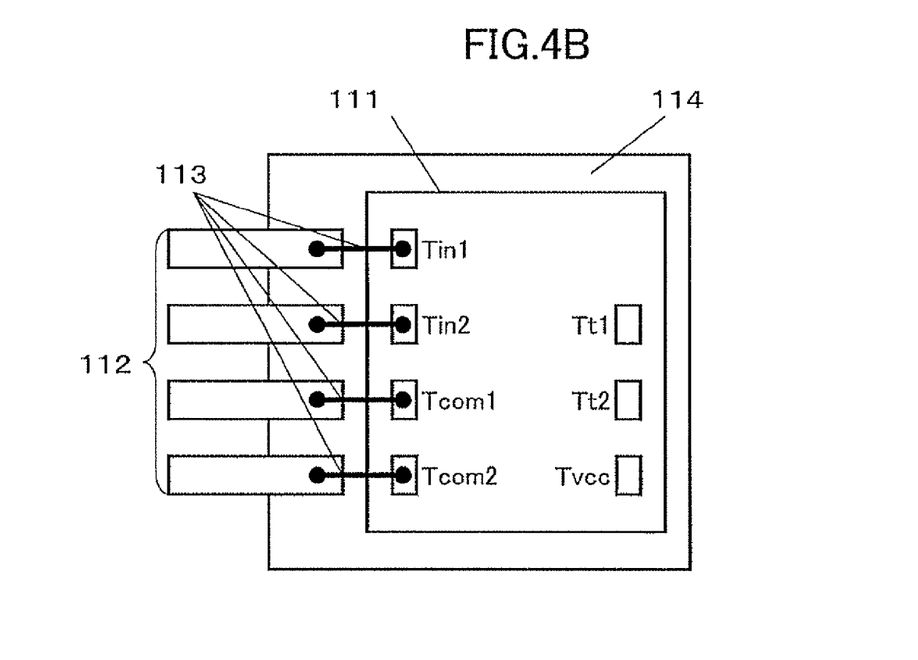

FIGS. 4A, 4B illustrate an example of an application of the embodiment of the present invention.

As shown in FIG. 4A, in the semiconductor device 100 according to the embodiment of the present invention, before the semiconductor chip 111 is packaged, probes 151 of an inspection device are brought in contact with the terminals Tin1, Tin2, Tcom1, Tcom2, Tvcc and the test terminals Tt1, Tt2. The operational status of the semiconductor chip 111 is detected by supplying data to the terminals Tin1, Tin2, Tcom1, Tcom2, Tvcc and the test terminals Tt1, Tt2 from the inspection device via the probes 151.

When conducting an inspection at the manufacturing stage, the terminal fixing information and the fixing bit information in the non-volatile memory 126 are all set to "0". Thus, when power is supplied from the probes 151 when the inspection is conducted, the terminal fixing information and the fixing bit information transferred from the non-volatile memory 126 to the register 127 are all "0". Accordingly, the switches 146, 147 of the test terminal status determining circuit 129 are shifted so that the test terminals Tt1, Tt2 are connected to the test control circuit 128 and an inspection can be conducted with the inspection device.

When the inspection at the manufacturing stage is completed, predetermined terminal fixing information and predetermined fixing bit information are written into the non-volatile memory 126. It is assumed in this example that the terminal fixing information indicates enable "1" and the fixing bit information indicates "01".

After the semiconductor chip 111 is packaged, the test terminals Tt1, Tt2 are covered inside the package 114, and cannot be contacted under regular conditions. When power is turned on after the semiconductor chip 111 is packaged, the terminal fixing information and the fixing bit information stored in the non-volatile memory 126 are transferred to the register 127 in response to power-on reset signals, and input to the test control circuit 128 corresponding to the test terminals Tt1, Tt2 is specified to be a predetermined level.

By making the terminal fixing information indicate enable "1", the test terminals Tt1, Tt2 are separated from all circuits inside the semiconductor chip 111. Thus, the test terminals Tt1, Tt2 cannot be used to analyze the inside of the semiconductor chip 111.

An inspection can be conducted by only making the probes contact the test terminals Tt1, Tt2, and therefore, a bonding process is not required. Accordingly, the mounting area of the semiconductor device 100 can be made small.

The non-volatile memory 126 can be overwritten from outside, and therefore, after the semiconductor chip 111 is packaged, the terminal fixing information and the fixing bit information can be overwritten. Furthermore, by sequentially switching the fixing bit information, the same test as that of the inspection can be conducted.

Moreover, a configuration in which the semiconductor chip 111 is arranged on a mounting substrate and the terminals of the semiconductor chip 111 are wire-bonded to terminals of the mounting substrate is more advantageous than a configuration in which the terminals of the semiconductor chip 111 are wire-bonded to lead frames. This is because in the former case it is not necessary to provide signal wirings on the mounting substrate for supplying low-level signals or high-level signals to the test terminals Tt1, Tt2.

Incidentally, another conceivable configuration of the test terminal status determining circuit 129 is to directly connect one terminal of the switch 146 to the power supply voltage Vcc without involving the switch 144 and directly connecting one terminal of the switch 147 to ground voltage without involving the switch 145. However, this configuration reduces the degree of freedom in the fixed level of the input to the test control circuit 128 corresponding to the test terminals Tt1, Tt2.

Figure 5:
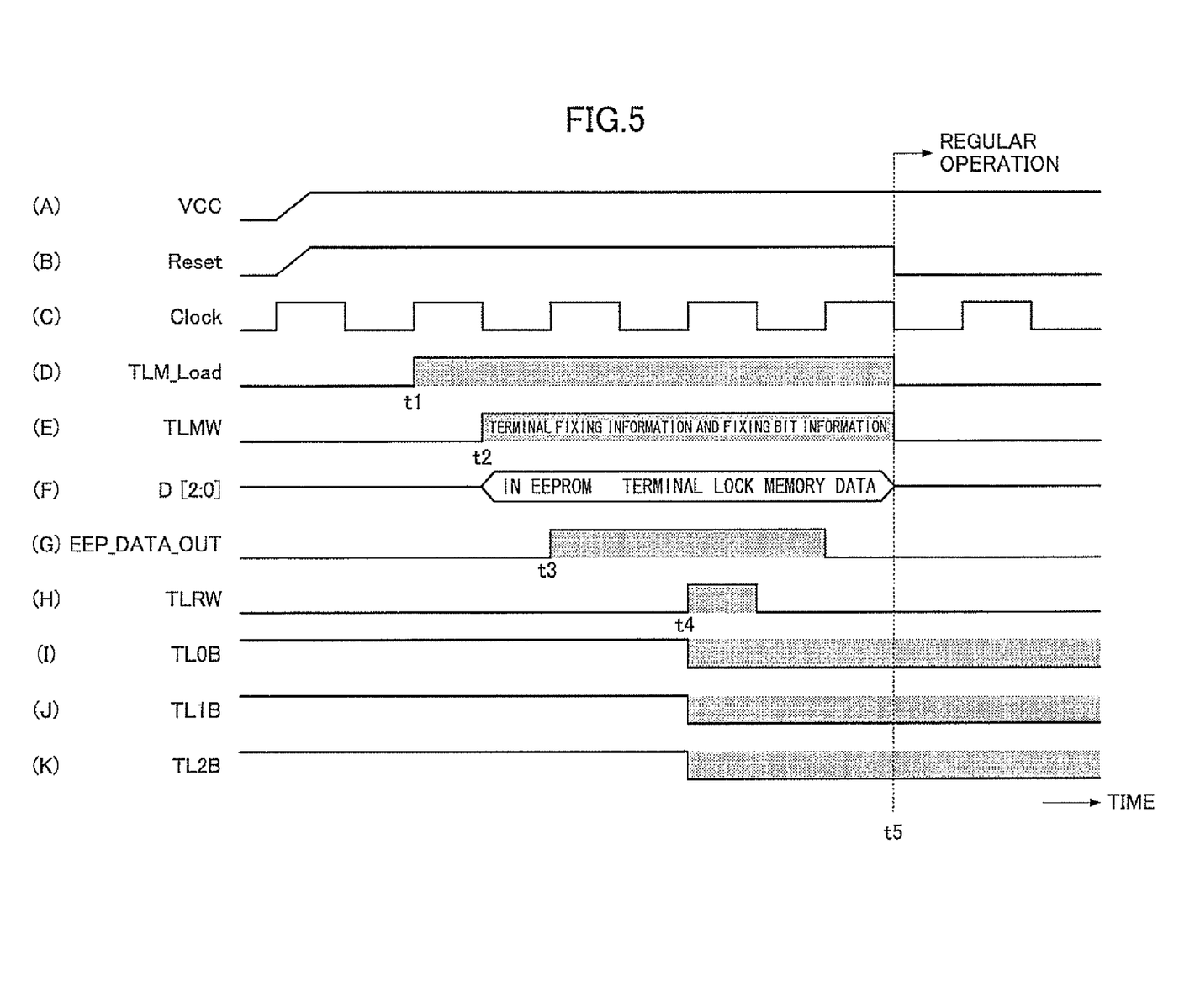

Operations of the semiconductor device 100 when power is switched on are described in detail with reference to a signal wave form chart shown in FIG. 5.

When an inspection is conducted at the manufacturing stage, as shown in (A), when the power supply voltage Vcc to be applied on the power supply terminal Tvcc is generated, the power-on reset circuit 130 generates a high-level power reset signal, as shown in (B). In response to this power reset signal, the status of the register 127 becomes a reset status (all high-level outputs).

After the power reset signal becomes high-level, at a time point t1 corresponding to the next rising clock edge of the clocks shown in (C), the memory control circuit 131 generates a load signal TLM_Load as shown in (D), so that the non-volatile memory 126 is selected. The memory control circuit 131 generates a signal TLMW at a time point t2 as shown in (E), so that a memory word storing the terminal fixing information and the fixing bit information in the non-volatile memory 126 is selected as shown in (F).

Next, the memory control circuit 131 generates an EEPROM data output control signal EEP_DATA_OUT at a time point t3 as shown in (G). Accordingly, the terminal fixing information and the fixing bit information of three bits (all "0") are output from the non-volatile memory 126 to a data bus.

Next, the memory control circuit 131 generates a register writing signal TLRW at a time point t4 as shown in (H), so that the terminal fixing information and the fixing bit information of three bits are written into the register 127. Accordingly, from the time point t4, the terminal fixing information "0" shown in (I) and the fixing bit information (all "0") shown in (J) and (K) are supplied from the register 127 to the test terminal status determining circuit 129.

Subsequently, at time point t5, the power-on reset circuit 130 changes the power reset signal shown in (B) to a low-level signal, and the semiconductor device 100 starts the regular operation.

After the inspection at the manufacturing stage is completed, the terminal fixing information indicating enable "1" and the fixing bit information indicating "01" as shown in FIG. 2 are written into the non-volatile memory 126.

Subsequently, when the semiconductor device 100 is running under regular conditions, i.e., not when inspections are being conducted, the same operations as those performed when the power is turned on are performed so that the terminal fixing information indicating enable "1" and the fixing bit information indicating "01" read from the non-volatile memory 126 are written into the register 127 and are then supplied from the register 127 to the test terminal status determining circuit 129.

When the semiconductor device 100 is to be diagnosed after shipment, the terminal fixing information and the fixing bit information are all specified as "0" and written into the non-volatile memory 126, and the power of the semiconductor device 100 is temporarily shut off and then turned on again so that a diagnosis can be conducted by using the test control circuit 128 in the same manner as that in the manufacturing stage. Furthermore, it is possible to directly write into the register 127 the terminal fixing information and the fixing bit information all indicating "0" and conduct a diagnosis by using the test control circuit 128 without shutting off the power.

Moreover, information can be transferred from the non-volatile memory 126 to the register 127 by the CPU 123.

<Battery Pack>

Figure 6:
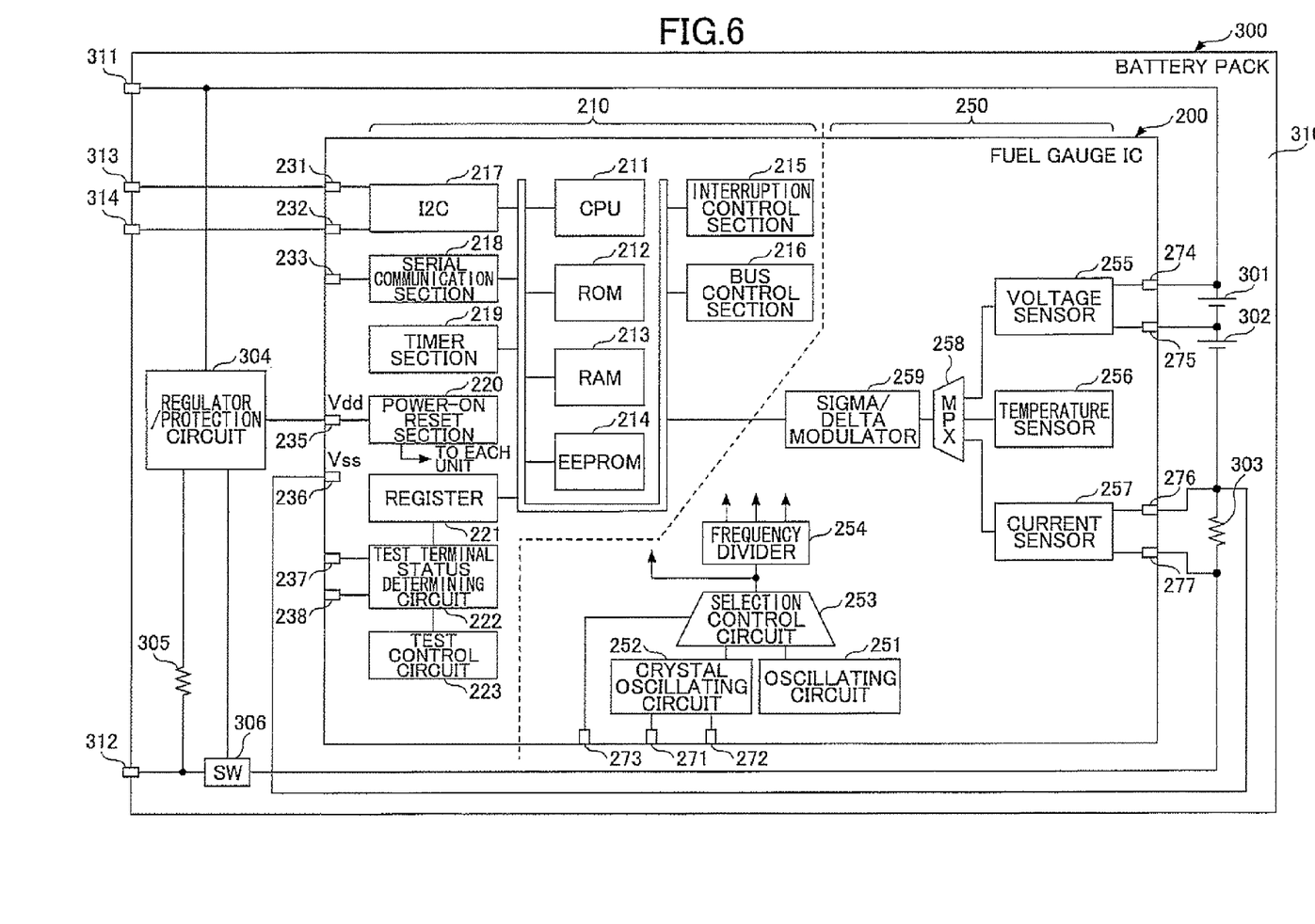
FIG. 6 is a block diagram of an embodiment of a battery pack to which the semiconductor device according to an embodiment of the present invention is applied.

FIG. 6 is a block diagram of an embodiment of a battery pack to which the semiconductor device according to an embodiment of the present invention is applied. A fuel gauge IC 200 is integrated on a semiconductor, and is substantially configured with a digital unit 210 and an analog unit 250.

The digital unit 210 includes a CPU 211, a ROM 212, a RAM 213, an EEPROM 214, an interruption control section 215, a bus control section 216, an I2C section 217, a serial communication section 218, a timer section 219, a power-on reset section 220, a register 221, a test terminal status determining circuit 222, and a test control circuit 223. The CPU 211, the ROM 212, the RAM 213, the EEPROM 214, the interruption control section 215, the bus control section 216, the I2C section 217, the serial communication section 218, the timer section 219, and the register 221 are interconnected by an internal bus.

The CPU 211 corresponds to the CPU 123 shown in FIG. 1, the ROM 212 and the RAM 213 correspond to the storage unit 124 shown in FIG. 1, the EEPROM 214 corresponds to the non-volatile memory 126 shown in FIG. 1, the I2C section 217 corresponds to the communication circuit 125 shown in FIG. 1, the power-on reset section 220 corresponds to the power-on reset circuit 130 shown in FIG. 1, the register 221 corresponds to the register 127 shown in FIG. 1, the test terminal status determining circuit 222 corresponds to the test terminal status determining circuit 129 shown in FIG. 1, and the test control circuit 223 corresponds to the test control circuit 128 shown in FIG. 1.

The CPU 211 executes a program stored in the ROM 212 to control the entire fuel gauge IC 200, and executes processes such as calculating the residual battery energy quantity by integrating the charge and discharge currents of the battery. The RAM 213 is used as a working area for these operations. The EEPROM 214 stores trimming information, etc.

The interruption control section 215 receives interruption requests from each of the sections of the fuel gauge IC 200, generates an interruption according to priority levels of the interruption requests, and reports the interruption to the CPU 211. The bus control section 216 controls which circuit section uses the internal bus.

The I2C section 217 is connected to communication lines via ports 231, 232 and performs two-wire system serial communication. The serial communication section 218 is connected to a communication line via a port 233 and performs one-wire system serial communication.

The timer section 219 counts the system clock, and the counted value is referred to by the CPU 211. The power-on reset section 220 detects that power Vdd is supplied to a port 235, generates a reset signal, and supplies the reset signal to each of the sections of the fuel gauge IC 200.

The register 221 receives information from the EEPROM 214. The test terminal status determining circuit 222 connects test ports (terminals) 237, 238 and the test control circuit 223 according to information held in the register 221. The test terminal status determining circuit 222 specifies input of a predetermined level supplied to the test control circuit 223 corresponding to the test ports 237, 238

When input is supplied from the test ports 237, 238, the test control circuit 223 changes the status of internal circuits according to the input, so that internal circuits of the fuel gauge IC 200 can be tested.

The analog unit 250 includes an oscillating circuit 251, a crystal oscillating circuit 252, a selection control circuit 253, a frequency divider 254, a voltage sensor 255, a temperature sensor 256, a current sensor 257, a multiplexer 258, and a sigma/delta modulator 259.

The voltage sensor 255, the temperature sensor 256, the current sensor 257, and the multiplexer 258 correspond to the detecting circuit 121 shown in FIG. 1, and the sigma/delta modulator 259 corresponds to the AD converter 122 shown in FIG. 1.

The oscillating circuit 251 is an oscillator with a PLL and outputs oscillating signals of several MHz. The crystal oscillating circuit 252 performs oscillation with crystal transducers externally attached to ports 271, 272 and outputs oscillating signals of several MHz. The oscillating wavelength of the crystal oscillating circuit 252 is highly precise with respect to the oscillating circuit 251.

The selection control circuit 253 selects oscillating frequency signals output from either one of the oscillating circuit 251 or the crystal oscillating circuit 252 based on selection signals received from a port 273, and supplies them as system clocks to each of the sections of the fuel gauge IC 200 as well as to the frequency divider 254. When selection signals are not received from the port 273, the selection control circuit 253 selects, for example, oscillating frequency signals output from the oscillating circuit 251. The frequency divider 254 divides the frequency clock to generate various clocks, and supplies them to each of the sections of the fuel gauge IC 200.

The voltage sensor 255 detects the voltages of batteries 301, 302 externally attached to ports 274, 275, respectively, and supplies detected analog voltage levels to the multiplexer 258. The temperature sensor 256 detects the environmental temperature of the fuel gauge IC 200, and supplies the detected analog temperature level to the multiplexer 258.

The ends of a resistance 303 used for current detection are connected to ports 276, 277. The current sensor 257 detects the current level flowing through the resistance 303 based on an electric potential drop across the ports 276, 277, and supplies the detected analog current level to the multiplexer 258.

The multiplexer 258 sequentially selects the detected analog voltage level, the detected analog temperature level, and the detected analog current level, and supplies them to the sigma/delta modulator 259. The sigma/delta modulator 259 performs sigma/delta conversion on each of the detected values to supply pulse density modulation signals to the CPU 211 via the internal bus. The CPU 211 performs a digital filter process to digitize the detected voltage, the detected temperature, and the detected current. Furthermore, the CPU 211 calculates the residual battery energy quantity by integrating the charge and discharge currents of the battery. The detected temperature is used for correcting the temperature.

The fuel gauge IC 200 is housed inside a chassis 310 together with the batteries (lithium ion batteries) 301, 302, the resistance 303 used for current detection, a regulator/protection circuit 304, a resistance 305, and a switch 306, thereby configuring a battery pack 300. A terminal 311 of the battery pack 300 is connected to a positive electrode of the battery 301 and a power supply input terminal of the regulator/protection circuit 304, and the power supply input terminal of the regulator/protection circuit 304 is connected to the port 235 of the power supply Vdd of the fuel gauge IC 200. A terminal 312 is connected to a ground terminal of the regulator/protection circuit 304 via the resistance 305, and is connected to the connection point of the resistance 303 used for current detection and the port 277 via the switch 306. The regulator/protection circuit 304 stabilizes the voltage between the terminals 311 and 312, and when this voltage deviates from a predetermined range, the regulator/protection circuit 304 performs a protecting operation by shutting down the switch 306.

The connection point of the resistance 303 used for current detection and the port 276 is connected to a port 236 of a power supply Vss of the fuel gauge IC 200. Terminals 313, 314 of the battery pack 300 are connected to the ports 231, 232, respectively, of the fuel gauge IC 200.

Figure 7:
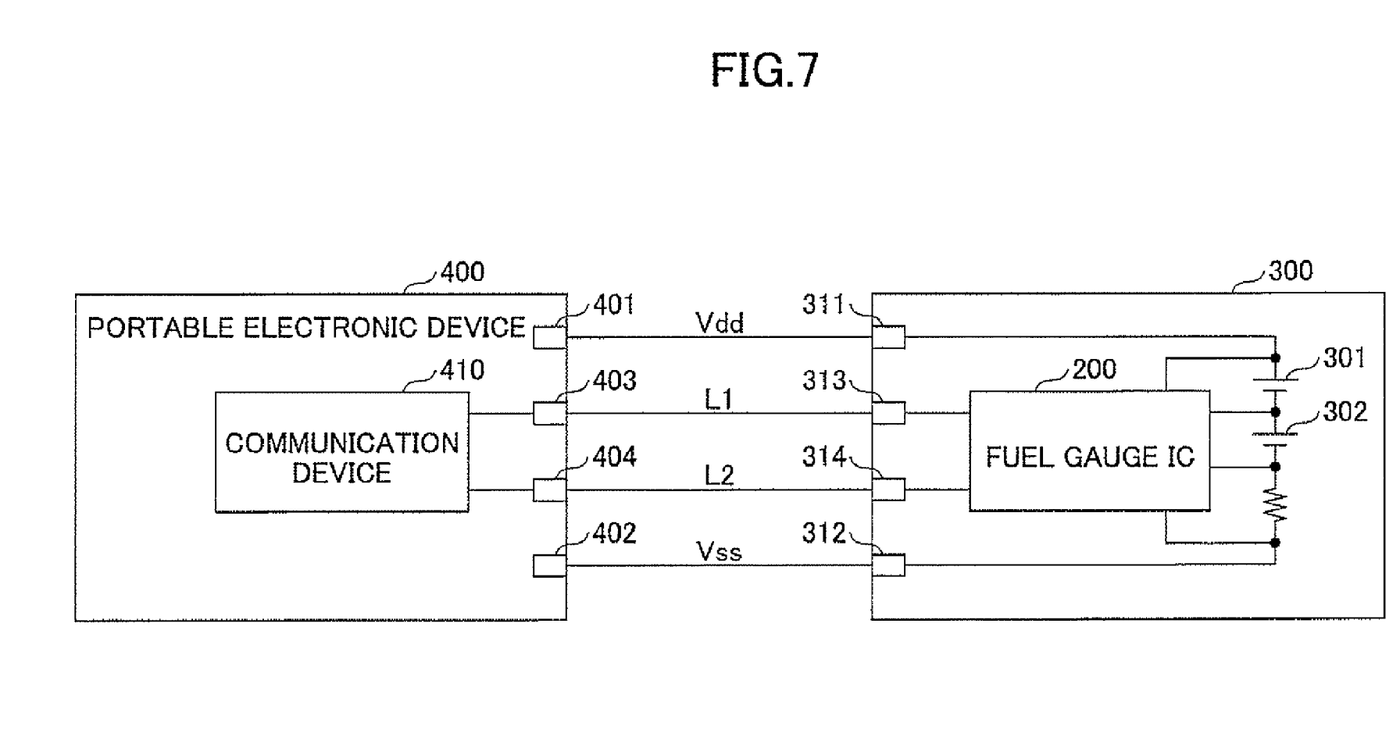
FIG. 7 is a block diagram of an embodiment of a portable electronic device employing the battery pack shown in FIG. 6.

FIG. 7 is a block diagram of an embodiment of a portable electronic device employing the battery pack shown in FIG. 6. A portable electronic device 400 shown in FIG. 7 is, for example, a portable personal computer, a digital still camera, or a mobile phone. A main circuit unit of the portable electronic device 400 is shown in FIG. 7. The portable electronic device 400 includes an I2C section and a CPU having the same configurations as that of the I2C section 217 and the CPU 211 shown in FIG. 6.

The terminals 311-314 of the battery pack 300 are respectively connected to terminals 401, 402 of power supplies Vdd, Vss and terminals 403, 404 connected to a clock line L1 and a data line L2 of the portable electronic device 400. Accordingly, power is supplied from the batteries 301, 302 in the battery pack 300 to the portable electronic device 400.

Under regular circumstances, the portable electronic device 400 operates as the master and the fuel gauge IC 200 operates as the slave. In response to a request received from the portable electronic device 400, the fuel gauge IC 200 reports a calculated residual battery energy quantity to a communication device 410 of the portable electronic device 400.

The present invention is not limited to the specifically disclosed embodiment, and variations and modifications may be made without departing from the scope of the present invention.

The present application is based on Japanese Priority Patent Application No. 2006-043980, filed on Feb. 21, 2006, and Japanese Priority Patent Application No. 2007-011478, filed on Jan. 22, 2007, the entire contents of which are hereby incorporated by reference.

What is claimed is:

1. A semiconductor device comprising:
   one or more test terminals;
   a test control circuit configured to receive signals as one or more inputs thereof from the one or more test terminals to test an internal circuit by changing a status of the internal circuit according to the signals;
   a non-volatile storage unit configured to store specification information used for specifying a connection status of the one or more test terminals;
   a specification information holding unit configured to hold the specification information;
   a transfer control unit configured to transfer the specification information from the non-volatile storage unit to the specification information holding unit when power is turned on; and
   a test terminal status determining unit configured to determine the connection status of the one or more test terminals according to the specification information received from the specification information holding unit;
   wherein after the test control circuit tests the internal circuit according to the signals received from the one or more test terminals, the specification information held in the specification information holding unit is renewed such that the one or more inputs of the test control circuit are fixed to a predetermined level.

2. The semiconductor device according to claim 1, wherein the specification information includes
   terminal fixing information indicating whether the test control circuit is to be connected to the one or more test terminals or the one or more inputs of the test control circuit are to be fixed to the predetermined level, and
   voltage setting information indicating a voltage level of the one or more inputs of the predetermined level.

3. The semiconductor device according to claim 2, wherein the voltage setting information is provided for each of the one or more inputs corresponding to the one or more test terminals.

4. The semiconductor device according to claim 1, further comprising:
   a power-on reset unit configured to perform power-on reset on the entire semiconductor device for a predetermined length of time from when the power is turned on;
   wherein the transfer control unit transfers the specification information from the non-volatile storage unit to the specification information holding unit while the power-on reset is being performed.

5. A manufactured semiconductor device comprising a pre-packaged semiconductor chip comprising:
   a plurality of terminals in which the terminals include input output terminals, a power terminal and test terminals;
   a power-on reset circuit coupled to the power terminal, the power-on reset circuit configured to produce a power-on reset signal which places the chip in a reset mode, the power-on reset circuit is configured to produce the power-on reset signal after the chip is powered up;
   a CPU coupled to the power-on reset circuit, the CPU is configured to time a duration of the reset mode of the chip and configured to place the chip in a regular operation mode after the timed duration of the reset mode exceeds a predetermined time period;
   a memory control circuit coupled to the power-on reset circuit, the memory control circuit configured to enable an erasable non-volatile memory to send terminal fixing information and fixing bit information stored in the non-volatile storage unit to a non-volatile memory;
   the erasable non-volatile memory coupled to the memory control unit and coupled to the volatile memory;
   the volatile memory coupled to a switching circuit and configured to send the information to the switching circuit;
   the switching circuit coupled to the test terminals and to a test control circuit, the switching circuit comprising a plurality of drivers and switches, in which the switching circuit is configured to be selectively driven and switched in accordance to the information to couple together the test terminals with a test control circuit when in a pre-packaged test mode, and the switching circuit is configured to be selectively driven and switched in accordance to the information to couple together a power source and a ground source to the test control circuit when in the reset mode;

the test control circuit configured to test internal circuits of the chip when in the reset mode; and a substrate mounted to the fuel gauge circuit such that the test terminals of the chip cannot be electrically coupled from outside the substrate.

6. A manufactured semiconductor device of claim 5 wherein the chip is an analog component of a fuel gauge circuit.

7. The manufactured semiconductor device of claim 6 further comprising at least one battery coupled to the fuel gauge circuit.

8. The manufactured semiconductor device of claim 6 further comprising a portable electronic device coupled to the fuel gauge circuit.

* * * * *